US012571086B2

(12) United States Patent
Allely et al.

(10) Patent No.: US 12,571,086 B2
(45) Date of Patent: Mar. 10, 2026

(54) METHOD OF PRODUCING A PHOSPHATABLE PART FROM A SHEET COATED WITH AN ALUMINUM-BASED COATING AND A ZINC COATING

(71) Applicant: ArcelorMittal, Luxembourg (LU)

(72) Inventors: Christian Allely, Maizières-lès-Metz (FR); Eric Jacqueson, Longeville-les-Metz (FR); Daniel Chaleix, Verny (FR)

(73) Assignee: ArcelorMittal, Luxembourg (LU)

( * ) Notice: Subject to any disclaimer, the term of this patent is extended or adjusted under 35 U.S.C. 154(b) by 899 days.

(21) Appl. No.: 15/552,135

(22) PCT Filed: Jan. 22, 2016

(86) PCT No.: PCT/IB2016/000037
§ 371 (c)(1),
(2) Date: Aug. 18, 2017

(87) PCT Pub. No.: WO2016/132194
PCT Pub. Date: Aug. 25, 2016

(65) Prior Publication Data
US 2018/0044774 A1 Feb. 15, 2018

(30) Foreign Application Priority Data
Feb. 19, 2015 (WO) .................. PCT/IB2015/000194

(51) Int. Cl.
| | | |
|---|---|---|
| *C23C 14/16* | (2006.01) | |
| *B21D 53/88* | (2006.01) | |
| | (Continued) | |

(52) U.S. Cl.
CPC .............. *C23C 14/16* (2013.01); *B21D 53/88* (2013.01); *B32B 15/012* (2013.01);
(Continued)

(58) Field of Classification Search
CPC ..... B21D 53/88; B32B 15/012; B32B 15/017; C21D 8/0221; C21D 9/46;
(Continued)

(56) References Cited

U.S. PATENT DOCUMENTS

| | | | | | |
|---|---|---|---|---|---|
| 3,438,754 | A | * | 4/1969 | Brooker | ................ C23C 14/025 428/650 |
| 4,298,661 | A | * | 11/1981 | Ikeno | .................... C23C 28/345 428/623 |

(Continued)

FOREIGN PATENT DOCUMENTS

| | | |
|---|---|---|
| EP | 2045360 | 4/2009 |
| EP | 2270257 | 1/2011 |

(Continued)

*Primary Examiner* — Mark Ruthkosky
*Assistant Examiner* — Sathavaram I Reddy
(74) *Attorney, Agent, or Firm* — Davidson Kappel LLC

(57) ABSTRACT
A steel sheet coated with an aluminum-based coating and a second zinc coating having a thickness less than or equal to 1.1 µm is provided. A method for preparing the coated steel
(Continued)

sheet, a method for preparing a press-hardened part from the steel sheet, a press-hardened part, and the use of the press-hardened part are also provided.

17 Claims, 2 Drawing Sheets

(51) Int. Cl.

| | | |
|---|---|---|
| *B32B 15/01* | (2006.01) | |
| *C21D 9/46* | (2006.01) | |
| *C23C 2/12* | (2006.01) | |
| *C23C 2/26* | (2006.01) | |
| *C23C 2/40* | (2006.01) | |
| *C23C 10/20* | (2006.01) | |
| *C23C 14/02* | (2006.01) | |
| *C23C 14/22* | (2006.01) | |
| *C23C 14/58* | (2006.01) | |
| *C23C 28/02* | (2006.01) | |
| *C25D 3/22* | (2006.01) | |
| *C25D 5/52* | (2006.01) | |
| *C25D 13/04* | (2006.01) | |
| *C25D 13/20* | (2006.01) | |

(52) U.S. Cl.
CPC .............. *B32B 15/017* (2013.01); *C21D 9/46* (2013.01); *C23C 2/12* (2013.01); *C23C 2/26* (2013.01); *C23C 2/40* (2013.01); *C23C 10/20* (2013.01); *C23C 14/025* (2013.01); *C23C 14/22* (2013.01); *C23C 14/5853* (2013.01); *C23C 28/021* (2013.01); *C25D 3/22* (2013.01); *C25D 5/52* (2013.01); *C25D 13/04* (2013.01); *C25D 13/20* (2013.01); *C21D 2211/002* (2013.01); *C21D 2211/008* (2013.01)

(58) Field of Classification Search
CPC ........ C21D 2211/002; C21D 2211/008; C22C 38/02; C22C 38/04; C22C 38/06; C22C 38/22; C22C 38/28; C22C 38/32; C23C 2/12; C23C 2/26; C23C 2/40; C23C 10/20; C23C 14/025; C23C 14/16; C23C 14/22; C23C 14/5853; C23C 28/021; C23C 28/025; C25D 3/22; C25D 5/52; C25D 13/04; C25D 13/20
See application file for complete search history.

(56) References Cited

U.S. PATENT DOCUMENTS

| | | | | |
|---|---|---|---|---|
| 5,135,817 A | * | 8/1992 | Shimogori | .............. C23C 14/16 428/621 |
| 7,892,654 B2 | * | 2/2011 | Hofmann | .............. C23C 28/028 148/531 |
| 7,998,535 B2 | | 8/2011 | De Meyer et al. | |
| 8,453,482 B2 | | 6/2013 | Maki et al. | |
| 8,722,203 B2 | | 5/2014 | Laurent et al. | |
| 9,644,252 B2 | | 5/2017 | Maki et al. | |
| 10,092,938 B2 | | 10/2018 | Yamanaka et al. | |
| 2004/0033386 A1 | * | 2/2004 | Pradhan | .................... C23C 2/02 428/659 |
| 2008/0308194 A1 | * | 12/2008 | Corquillet | ............... C22C 38/22 148/531 |
| 2009/0220815 A1 | * | 9/2009 | Canourgues | .......... C23C 28/021 428/583 |
| 2010/0221572 A1 | * | 9/2010 | Laurent | .................... C21D 1/18 428/653 |
| 2010/0285333 A1 | * | 11/2010 | Kwak | .................. C23C 28/021 428/659 |
| 2010/0294400 A1 | | 11/2010 | Lupp et al. | |
| 2010/0307644 A1 | * | 12/2010 | Gil Otin | ................. C22C 38/22 148/546 |
| 2012/0085466 A1 | | 4/2012 | Lupp et al. | |
| 2012/0129001 A1 | * | 5/2012 | Schuhmacher | ....... B32B 15/012 428/650 |
| 2015/0079420 A1 | * | 3/2015 | Hanlon | ................ C21D 8/0247 428/653 |
| 2016/0017452 A1 | | 1/2016 | Puerta Velasquez et al. | |
| 2017/0233859 A1 | | 8/2017 | Maalman et al. | |
| 2019/0160519 A1 | | 5/2019 | Maki et al. | |

FOREIGN PATENT DOCUMENTS

| | | | |
|---|---|---|---|
| JP | S61157693 | A | 7/1986 |
| JP | H04325667 | A | 11/1992 |
| JP | H06146018 | A | 5/1994 |
| JP | H1088384 | A | 4/1998 |
| KR | 20090128414 | A | 12/2009 |
| KR | 1020140081621 | A | 7/2014 |
| KR | 20140119738 | A | 10/2014 |
| RU | 2384648 | C2 | 3/2010 |
| WO | 2012137687 | A1 | 10/2012 |
| WO | 2014037627 | | 3/2014 |
| WO | 2015098653 | A1 | 7/2015 |

* cited by examiner

//Legend to Figure 5//

Temperature (ºC)

Humidity (1%)

Vaporization Salt (NaCl 1%)

//x-axis// Time (h)

METHOD OF PRODUCING A PHOSPHATABLE PART FROM A SHEET COATED WITH AN ALUMINUM-BASED COATING AND A ZINC COATING

The invention relates to a method for preparing press-hardened steel parts manufactured from sheets coated with an aluminum-based coating and a zinc coating. The part has good characteristics with regard to phosphatation, and therefore exhibits good paint adhesion. It is in particular intended for manufacturing motor vehicle parts.

BACKGROUND

Press-hardened parts may be coated with an aluminum-based alloy that has good anticorrosion properties and good thermal properties. Generally, the method for preparing these parts comprises acquiring a steel sheet, cutting the sheet to obtain a blank, heating the blank, press-hardening followed by cooling to obtain martensitic or martensitic-bainitic transformation hardening, such that the structure of the steel comprises at least 75% equiaxed iron, an amount of martensite greater than or equal to 5% and less than or equal to 20%, an amount of bainite less than or equal to 10%. The hardened parts thereby obtained have very good mechanical characteristics.

Usually, a paint film is added to press-hardened parts, in particular a cataphoresis layer. Phosphatation is often performed beforehand. In this way, phosphate crystals form on the surface of the hardened part to be coated, increasing adhesion of paint, and in particular, adhesion of the cataphoresis layer.

Parts coated with an aluminum-based alloy are not phosphatable, that is, no phosphate crystals form on the surface of the coating. The addition of a paint film is thus performed directly without prior phosphatation. The microroughness of the surface of parts coated with an aluminum-based alloy enables paint adhesion. Nevertheless, under some conditions, paint is not distributed homogeneously on the surface of the part, resulting in areas of red rust. Red rust appears in areas where paint is deeply embedded in the aluminum-based coating.

Patent application EP2270257 is known. It discloses a steel sheet for press-hardening comprising a first aluminum-based coating, and a second coating having a wurtzite structure, the compound preferably being zinc oxide (ZnO). A ZnO coating enables phosphatation to be performed after the press-hardening method. Nevertheless, in practice, the implementation of this method results in a relatively low degree of phosphate crystal coverage on the surface of the part, on the order of 20 to 70%. This degree of coverage is unacceptable because it does not enable good paint adhesion on the surface of the part.

SUMMARY OF THE INVENTION

An object of the present invention is to remedy the disadvantages of the prior art by providing a phosphatable press-hardened part, which therefore exhibits good paint adhesion, from a coated steel sheet. It aims to provide, in particular, a press-hardened part capable of being phosphated so as to obtain a high degree of phosphate crystal coverage on the surface of the part, in particular, a degree of coverage greater than or equal to 80%.

It also relates to a method for preparing said steel sheet.

It further relates to a method for manufacturing a phosphatable press-hardened part, under advantageous productivity conditions.

It further relates to the use of a press-hardened part for manufacturing motor vehicle parts.

The present invention provides a steel sheet for press hardening coated with an aluminum-based coating and further comprising a second zinc coating having a thickness less than or equal to 1.1 $\mu$m.

The present invention also provides a method for preparing a steel sheet coated.

The present invention also provides a method for preparing a press-hardened part coated with a phosphatable coating comprising the following sequential steps wherein:

A) a steel sheet is provided, for press-hardening,
B) the sheet obtained in step A) is cut to obtain a blank, then
C) the blank is heated at a temperature T1 in a range from 840° C. to 950° C. to obtain a completely austenitic structure in the steel,
D) the blank is then transferred to a press,
E) the blank is hot-pressed to obtain a part,
F) the part obtained in step E) is cooled to obtain a martensitic or a martensitic-bainitic structure in the steel composed of at least 75% equiaxed iron, an amount of martensite greater than or equal to 5% and less than or equal to 20%, an amount of bainite less than or equal to 10%.

A press-hardened part and use of a press-hardened part are also provided.

BRIEF DESCRIPTION OF THE DRAWINGS

Additional features and advantages of the invention will become apparent upon reading the description that follows.

In order to illustrate the invention, various embodiments and tests will be described by way of non-limiting examples, in particular with reference to the figures which represent.

Figure 1:
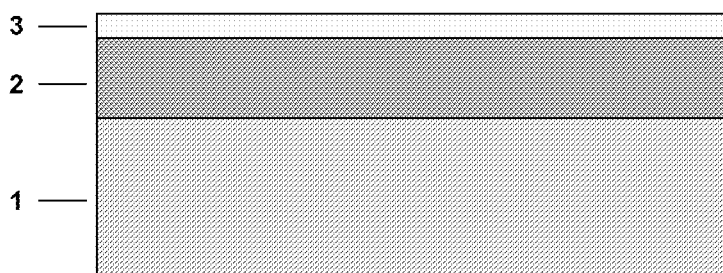
FIG. 1 is a schematic representation of a coated steel sheet according to an embodiment of the invention.
Figure 2:
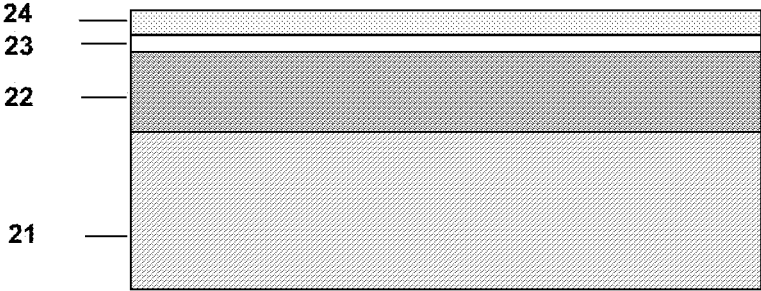
FIG. 2 is a schematic representation of a coated steel sheet according to another embodiment of the invention.

For FIGS. 1 and 2, the thickness of the layers shown is provided only for purposes of illustration and cannot be considered as a true-to-scale representation of the various layers.

Figure 3:
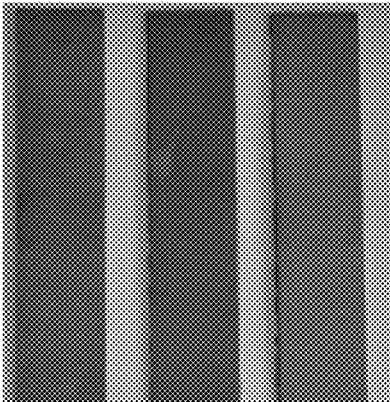
Figure 4:
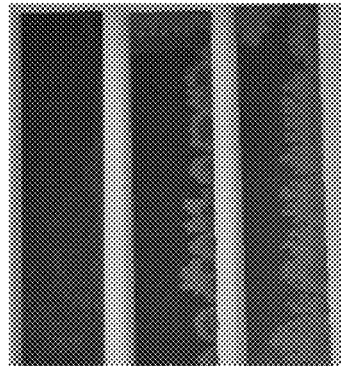

FIGS. 3 and 4 show the actual size of two sides of hardened parts from steel sheets provided with a first aluminum-based coating having a thickness of 25 $\mu$m and on one side a second zinc coating deposited by electroplating having a thickness of 1 $\mu$m, 2 $\mu$m, and 3 $\mu$m.

Figure 5:
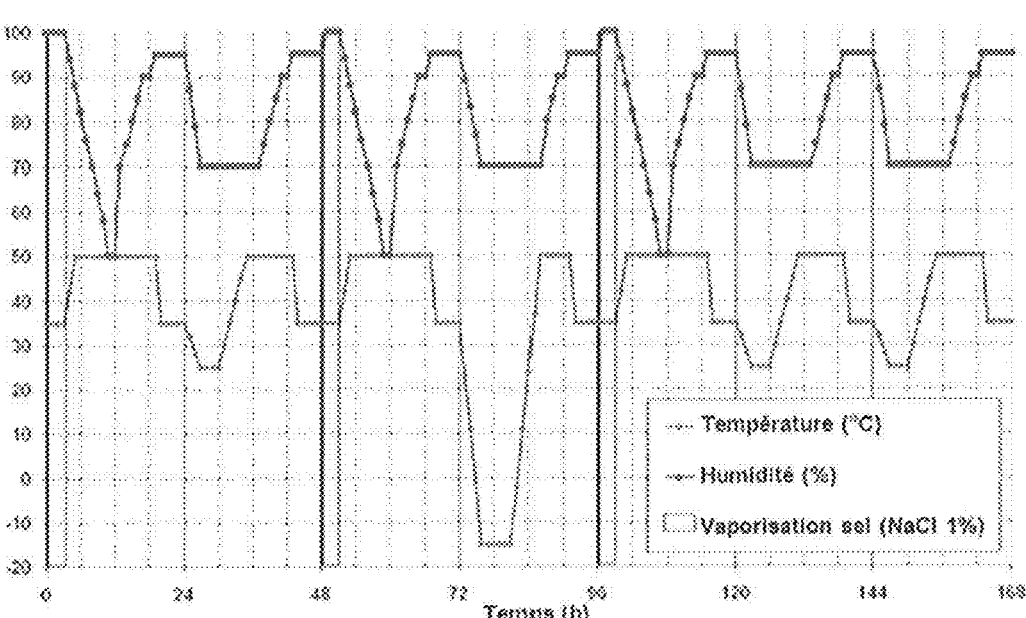

FIG. 5 shows a corrosion cycle for standard VDA 231-102.

DETAILED DESCRIPTION

The following terms are defined:

"zinc coating" means a coating primarily comprising zinc and possibly impurities. Preferably, the coating contains zinc and possibly impurities, "aluminum-based coating" means a coating comprising by weight composition an amount of aluminum greater than 50%, preferably greater than or equal to 70%, more preferably greater than or equal to 85%, advantageously greater than or equal to 88%. This coating may be alloyed or unalloyed, "degree of phosphate crystal coverage" is defined by a percentage. 0% means that the surface of the part is not at all covered with phosphate crystals, 100% means that the surface of the part is entirely covered.

For all FIGS. 1 to 5 and subsequent to the invention, the designation "steel" or "steel sheet" refers to steel sheet for press-hardening having a composition enabling the part to achieve a tensile strength greater than or equal to 500 MPa, preferably greater than or equal to 1000 MPa, advantageously greater than or equal to 1500 MPa. The weight composition of the steel sheet is preferably the following: 0.03%≤C≤0.50%; 0.3%≤Mn≤3.0%; 0.05%≤Si≤0.8%; 0.015%≤Ti≤0.2%; 0.005%≤Al≤0.1%; 0%≤Cr≤2.50%; 0%≤S≤0.05%; 0%≤P≤0.1%; 0%≤B≤0.010%; 0%≤Ni≤2.5%; 0%≤Mo≤0.7%; 0%≤Nb≤0.15%; 0%≤N≤0.015%; 0%≤Cu≤0.15%; 0%≤Ca≤0.01%; 0% W≤0.35%, the balance of the composition comprising iron and unavoidable impurities resulting from the process.

For example, the steel sheet is a 22MnB5 sheet having the following weight composition:
0.20%≤C≤0.25%
0.15%≤Si≤0.35%
1.10%≤Mn≤1.40%
0%≤Cr≤0.30%
0%≤Mo≤0.35%
0%≤P≤0.025%
0%≤S≤0.005%
0.020%≤Ti≤0.060%
0.020%≤Al≤0.060%
0.002%≤B≤0.004%,
the balance of the composition being iron and unavoidable impurities resulting from the process.

The steel sheet may also be a Usibor®2000 sheet having the following weight composition:
0.24%≤C≤0.38%
0.40%≤Mn≤3%
0.10%≤Si≤0.70%
0.015%≤Al≤0.070%
0%≤Cr≤2%
0.25%≤Ni≤2%
0.020%≤Ti≤0.10%
0%≤Nb≤0.060%
0.0005%≤B≤0.0040%
0.003%≤N≤0.010%
0.0001%≤S≤0.005%
0.0001%≤P≤0.025%
it being understood that the content of titanium and nitrogen satisfy:

$$Ti/N > 3.42,$$

and that the content of carbon, manganese, chrome and silicon satisfy:

$$2.6C + \frac{Mn}{5.3} + \frac{Cr}{13} + \frac{Si}{15} \geq 1.1\%$$

the composition optionally includes one or more of the following elements:
0.05%≤Mo≤0.65%
0.001%≤W≤0.30%
0.0005%≤Ca≤0.005%,
the balance of the composition being iron and unavoidable impurities resulting from the process.

In another example, the steel sheet is a Ductibor®500 sheet having the following weight composition:
0.040%≤C≤0.100%
0.80%≤Mn≤2.00%
0%≤Si≤0.30%
0%≤S≤0.005%
0%≤P≤0.030%
0.010%≤Al≤0.070%
0.015%≤Nb≤0.100%
0.030%≤Ti≤0.080%
0%≤N≤0.009%
0%≤Cu≤0.100%
0%≤Ni≤0.100%
0%≤Cr≤0.100%
0%≤Mo≤0.100%
0%≤Ca≤0.006%,
the balance of the composition being iron and unavoidable impurities resulting from the process.

Steel sheets are produced by hot rolling and may optionally be cold-rolled according to the desired thickness.

It being understood that, first of all, the invention relates to a coated steel sheet. FIG. 1 shows an embodiment of sheet 1 according to the invention. It is provided with an aluminum-based coating 2 further comprising a second zinc coating 3 having a thickness less than or equal to 1.1 μm; preferably less than or equal to 1.0 μm; more preferably less than or equal to 0.7 μm and preferentially less than or equal to 0.5 μm. Advantageously, the zinc coating has a thickness greater than or equal to 0.1 μm.

Without being held to a theory, it appears that if these thickness conditions are not met, and in particular if the zinc thickness is too high, not all the zinc is oxidized to zinc oxide (ZnO) during heat treatment. Indeed, the oxygen present in the furnace will take too long to diffuse into the zinc coating to oxidize it completely. Therefore, some of the zinc will remain too long in the liquid state, and the still-liquid zinc will diffuse into the aluminum-based coating and then into the steel. Zinc that has diffused deep into the substrate may cause brittleness and loss of adhesion of the upper layers, that is to say, of the aluminum-based coating and the cataphoresis layer.

Furthermore, if the thickness conditions are not met, it is also possible that the microroughness of the surface will increase as the thickness of the zinc coating increases, thus promoting areas of red rust after deposition of the cataphoresis layer.

Therefore, in most cases, if the degree of phosphate crystal coverage is low, there is a risk of poor adhesion of the cataphoresis layer. However, in some cases, even though the degree of phosphate crystal coverage is high, there is a risk of loss of adhesion of the cataphoresis layer and poor resistance to red rust under this cataphoresis layer.

Finally, there is a risk that zinc, remaining too long in the liquid state, will pollute the furnace in which heat treatment takes place.

The aluminum-based coating is preferably carried out by hot dipping in a molten metal bath. Usually, the bath comprises up to 3% iron and 9% to 12% silicon, the balance being aluminum. The thickness of the layer is, for example, comprised between 5 μm and 50 μm, preferably between 10 μm and 35 μm. During heat treatment prior to hot deformation, the coating forms an alloyed layer exhibiting high resistance to corrosion, to abrasion, to wear, and to fatigue.

Preferably, the product of the thickness of the aluminum-based coating and the thickness of the zinc coating is comprised between 2 and 25, preferably between 4 and 25, more preferably between 4 and 16, and advantageously between 6 and 13; the thickness of the zinc coating being less than or equal to 1.1 μm, preferably less than or equal to 1.0 μm, more preferably less than or equal to 0.7 μm and preferentially less than or equal to 0.5 μm.

Without being held to a theory, it is possible that if these conditions are not met, in particular if the thickness of the aluminum-based coating is too high, the aluminum-based coating will remain too long in the liquid phase. Therefore, the ZnO layer formed at the beginning of the heat treatment and the aluminum-based coating will interact over a long period. This interaction may result in the reduction by aluminum of the ZnO layer to Zn, this process being governed by slow kinetics.

Zinc coating 3 may be deposited by any appropriate method, for example by cementation, by electroplating, or by sonic jet vapor deposition (JVD) under vacuum.

According to one embodiment, the zinc coating is deposited by electroplating, for example, by immersion in a zinc sulfate ($ZnSO_4$) bath. Advantageously, the temperature of the bath T3 is less than 70° C., T3 preferably ranges from 50° C. to 60° C.

According to another embodiment, the zinc coating is deposited by cementation. When the zinc coating is deposited by cementation, it is carried out either by spraying, or by immersion. Thus, the steel sheet coated with an aluminum-based metal coating is immersed in a bath or sprayed with a solution of sodium hydroxide (NaOH) and zinc oxide (ZnO). Advantageously, the immersion or the spraying is carried out for a time t4 ranging from 1 to 20 seconds, t4 preferably ranging from 5 to 10 seconds. It is carried out at a temperature T4 ranging from 40 to 60° C., T4 preferably being 60° C.

Without being held to a particular theory, the NaOH and ZnO mixture enables the formation of sodium zincate ($Na_2ZnO_2$), according to the following reaction: $2NaOH+ZnO \rightarrow Na_2ZnO_2+H_2O$. Thereafter, $Na_2ZnO_2$ will react with aluminum present in the aluminum-based coating to form a zinc coating on the steel sheet coated with the aluminum-based coating according to the following reactions: $2Al+3Na_2ZnO_2+2H_2O \rightarrow 3Zn+2NaAlO_2+4NaOH$.

According to another embodiment, a zinc coating is deposited by sonic jet vapor deposition under vacuum. According to this embodiment, zinc metal vapor is generated by induction heating of a crucible containing a zinc bath heated at a temperature T5 of at least 600° C., preferably T5 is 700° C., in a vacuum chamber at a pressure $P_5$ preferably between $6 \cdot 10^{-2}$ and $2 \cdot 10^{-1}$ mbar. Vapor escapes from the crucible via a conduit which leads to an outlet orifice, preferably calibrated, so as to form a sonic velocity jet directed toward the surface of the substrate to be coated.

Advantageously, prior to zinc deposition carried out by JVD, a steel sheet provided with an aluminum-based coating is coated with a thin layer of stainless steel comprising by weight composition at least 10% chrome, the balance being iron, additional elements such as nickel, carbon, molybdenum, silicon, manganese, phosphorus or sulfur and impurities associated with the manufacturing process. Preferably, the stainless steel layer comprises at least 10% chrome, at least 8% nickel, the balance being iron, additional elements as previously described and impurities associated with the manufacturing process. This layer is preferably stainless steel 316 comprising by weight as follows: 16≤Cr≤18% and 10≤Ni≤14%. For example, this layer is stainless steel 316L whose weight composition is as follows: C=0.02%; 16≤Cr≤18%; 10.5≤Ni≤13%; 2≤Mo≤2.5%, Si=1%; Mn=2%; P=0.04% and S=0.03%. Its thickness may be, for example, greater than or equal to 2 nm, preferably between 2 and 15 nm. FIG. 2 represents this embodiment wherein sheet 21 is coated with an aluminum-based coating 22, a thin layer of stainless steel 23, and a third zinc coating 24. The stainless steel layer may be deposited by any method known to those skilled in the art. It is, for example, deposited by electroplating or by cathodic magnetron sputtering.

Regardless of the deposition method used to deposit the zinc coating, alkaline degreasing may be carried out to increase adhesion of a zinc coating layer. Advantageously, degreasing is carried out by using an alkaline bath comprising, for example, NaOH and/or potassium hydroxide (KOH), and surfactants. Degreasing is advantageously carried out by immersion or spraying for a time t6 ranging from 1 to 120 seconds, preferably from 2 to 20 seconds. The degreasing temperature T6 ranges from 30° C. to 90° C., T6 preferably being 60° C. The pH of the bath ranges from 10 to 14.

Acid degreasing may also be considered. In this case, the chemical bath comprises, for example, phosphoric acid ($H_3PO_4$) and surfactants. The pH of the bath ranges from 0 to 2.

Regardless of the type of degreasing implemented, it is generally followed by rinsing.

Steel sheets according to the invention are then press-hardened. This method involves providing a steel sheet previously coated according to the invention, then cutting the sheet to obtain a blank. This blank is then heated in a non-protective atmosphere to the austenization temperature T1 of the steel which ranges from 840° C. to 950° C., preferably from 840° C. to 930° C. Preferably, the blank is heated for a time t1 ranging from 3 to 12 minutes, preferably 4 to 10 minutes, in an inert atmosphere or an atmosphere comprising air. During this heat treatment, the zinc coating is oxidized to ZnO.

After heat treatment, the blank is transferred to a hot-stamping tool, then hot-stamped at a temperature T2 ranging from 600 to 830° C. The part obtained is then cooled either in the tool itself, or after transfer to a specific cooling tool.

The cooling rate is controlled as a function of the composition of the steel, such that its final microstructure at the end of the press-hardening process primarily comprises martensite, preferably containing martensite, or martensite and bainite or comprising at least 75% equiaxed ferrite, an amount of martensite greater than or equal to 5% and less than or equal to 20%, and an amount of bainite less than or equal to 10%.

A phosphatable press-hardened part having a ZnO layer is thus obtained according to the invention.

For automotive applications, after phosphatation, each part is dipped in a cataphoresis bath. It is also possible to consider applying, sequentially, a layer of primer paint, a layer of basecoat paint, and optionally, a topcoat layer.

Before applying the cataphoresis layer to the part, it is degreased beforehand then phosphated so as to ensure adhesion of the cataphoresis layer. After phosphating a hardened part according to the invention, a press-hardened part is obtained comprising a ZnO layer and also a phosphate crystal layer on the ZnO layer. There is a high degree of phosphate crystal coverage on the surface of the hardened part. Preferably, the degree of phosphate crystal coverage on the part surface is greater than or equal to 80%, more preferably greater than or equal to 90% and advantageously greater than or equal to 99%.

The cataphoresis layer provides additional protection to the part against corrosion. The primer paint layer, usually applied by spray gun, prepares the final appearance of the part and protects it against stone chips and against UV. The basecoat paint layer gives the part its color and final appearance. The topcoat layer gives the part surface good mechanical resistance, resistance to aggressive chemical agents, and a good surface appearance.

Generally, the thickness of the phosphatation layer is comprised between 1 μm and 2 μm. Paint films used to protect and guarantee an optimal surface appearance for the parts, comprise for example a cataphoresis layer from 8 μm to 25 μm thick, a primer paint layer from 35 μm to 45 μm thick and a base paint layer from 40 μm to 50 μm thick.

In cases where paint films further comprise a topcoat layer, the thicknesses of the various paint layers are generally as follows:

cataphoresis layer: between 8 μm and 25 μm, preferably less than 20 μm, primer paint layer: less than 45 μm, base paint layer: less than 20 μm, and topcoat layer: less than 55 μm.

Preferably, the total thickness of the paint films is less than 120 μm, or even less than 100 μm.

The invention will now be explained by way of tests that are indicative but not limiting.

EXAMPLES

For all tests, the following steels were used: Usibor®1500 or 22MnB5. They were coated with an aluminum-based coating comprising by weight composition 9% silicon, 3% iron, and 88% aluminum, having a thickness of 14 or 25 μm.

The weight composition of the Usibor®1500 steel sheet used in the examples is as follows: C=0.2252%; Mn=1.1735%; P=0.0126%, S=0.0009%; N=0.0037%; Si=0.2534%; Cu=0.0187%; Ni=0.0197%; Cr=0.180%; Sn=0.004%; Al=0.0371%; Nb=0.008%; Ti=0.0382%; B=0.0028%; Mo=0.0017%; As=0.0023% and V=0.0284%.

For example, "Usibor® AluSi® 14 μm" indicates a Usibor®1500 steel as previously defined having an aluminum-based coating comprising by weight composition 9% silicon, 3% iron, and 88% aluminum, having a thickness of 14 μm.

For example, "22MnB5 AlSi 14 μm" indicates a 22MnB5 steel provided with an aluminum-based coating comprising by weight composition 9% silicon, 3% iron, and 88% aluminum having a thickness of 14 μm.

Example 1: Phosphatability Test and Zinc Behavior Test

The phosphatability test is used to determine the distribution of phosphate crystals on a press-hardened part, in particular by evaluating the degree of coverage on the surface of the part.

Example 1a

First, a series of 3 samples is made, designated 1, 2, and 3.

Samples 1 and 2 are obtained from a 22MnB5 steel sheet provided with a first aluminum-based coating and second ZnO coating having a thickness of 0.2 μm according to the method described in EP2270257.

Sample 3 is obtained from a Usibor® AluSi® 25 μm steel sheet.

Sample 4 is obtained from a Usibor® AluSi® 25 μm steel sheet further provided with a zinc coating deposited by cementation having a thickness of 0.17 μm. Zinc deposition is carried out by immersion in a bath comprising NaOH at a concentration of 150 g $L^{-1}$ and ZnO at a concentration of 15 g $L^{-1}$ for 5 seconds. The temperature of the bath is 60° C.

For each of the samples, the coated steel sheet is cut to obtain a blank. The blank is then heated at a temperature of 900° C. for a period ranging from 5 minutes to 5 minutes 30 seconds. The blank is then transferred to a press, then hot-stamped to obtain a part. Finally, said part is cooled to obtain martensitic transformation hardening.

Degreasing is then performed using a solution of Gardoclean® 5176 and Gardobond® H 7352 at a temperature of 55° C. It is followed by rinsing with water. The surface of the part is then activated by immersion using a solution of Gardolene® V6513 at ambient temperature. Finally, phosphatation is carried out by immersion for 3 minutes in a bath comprising a solution of Gardobond® 24 TA at a temperature of 50° C. The part is rinsed with water then dried with hot air. The surface of these phosphated samples is observed using SEM. The results are shown in the table below:

| | Sample | | | |
| --- | --- | --- | --- | --- |
| | 1 (according to EP2270257) | 2 (according to EP2270257) | 3 | 4 |
| Steel sheet | 22MnB5 AlSi 14 μm + ZnO | 22MnB5 AlSi 25 μm + ZnO | Usibor ® AluSi ® 25 μm | Usibor ® AluSi ® 25 μm + Zn |
| Heating time at 900° C. | 5 minutes 30 seconds | 5 minutes 30 seconds | 5 minutes | 5 minutes |
| Type of deposit | ZnO deposited by coating | ZnO deposited by coating | X | Zn deposited by cementation |
| Layer thickness | 0.2 μm | 0.2 μm | X | 0.17 μm |
| Degree of coverage | 65% | 20% | 0% | >99% |

It is noted that only Sample 4 exhibits a high degree of phosphate crystal coverage on the hardened part.

Example 1 b

Another series of samples is made, designated 4, 5, and 6.

Sample 4 is obtained from a Usibor® AluSi® 25 μm steel sheet, further provided on one side of the sheet with a second zinc coating deposited by electroplating having a thickness of 1 μm.

Sample 5 is obtained from a Usibor® AluSi® 25 μm steel sheet further provided on one side of the sheet with a second zinc coating deposited by electroplating having a thickness of 2 μm.

Sample 6 is obtained from a Usibor® AluSi® 25 μm steel sheet further provided on one side of the sheet with a second zinc coating deposited by electroplating having a thickness of 3 μm.

For zinc deposition by electroplating, first, degreasing of the sheet is carried out by immersion for 3 seconds in a Novaclean® 301 solution at a temperature of 80° C. Degreasing is followed by rinsing with water. Thereafter, brightening is carried out by immersion for 4 seconds in a sulfuric acid solution at ambient temperature. Brightening is followed by rinsing with water. The sheet is then immersed in an electrolytic bath comprising sulfuric acid ($H_2SO_4$) and zinc sulfate ($ZnSO_4$) at a temperature of 50° C. The current density applied to the steel sheet is 80 A/dm². The pH of the bath is 0.8.

The press-hardening method described in Example 1a is then applied to these samples. In this case, the blank is heated at a temperature T1 of 900° C. for a time t1 of 6 minutes 30 seconds. The surface of the phosphated samples is then observed using SEM. The results are shown in the table below:

| | Sample | | |
|---|---|---|---|
| | 4 | 5 | 6 |
| Steel sheet | Usibor ® AluSi ® 25 µm + Zn | Usibor ® AluSi ® 25 µm + Zn | Usibor ® AluSi ® 25 µm + Zn |
| Type of deposit | Zn deposited by electro-plating | Zn deposited by electro-plating | Zn deposited by electro-plating |
| Layer thickness | 1 µm | 2 µm | 3 µm |
| Coverage rate | 95% | 60% | 65% |

It is noted that only Sample 4 exhibits a high degree of phosphate crystal coverage on the surface of the hardened part.

The behavior of zinc during heat treatment at 900° C. was also observed for each of samples 4 to 6. We studied the behavior of zinc on the side where zinc deposition occurred and the opposite side that had not been coated with zinc. FIGS. 3 and 4 show Samples 4, 5, and 6 arranged in this order. The results are shown in the table below:

| | Sample | | |
|---|---|---|---|
| | 4 | 5 | 6 |
| Layer thickness | 1 µm | 2 µm | 3 µm |
| FIG. | | 3 | |
| Behavior of zinc on the surface where zinc was deposited | Good behavior | Good behavior | Good behavior |
| FIG. | | 4 | |
| Appearance of the opposite surface | Good behavior | Diffusion of zinc on the opposite surface | Diffusion du zinc sur la face opposée |

It is noted that the behavior of zinc was good during heat treatment, that is, that there is nothing notable to report for Sample 4. However, when the thickness of the zinc layer is 2 µm or 3 µm (samples 5 and 6), zinc diffuses onto the opposite side. Zinc diffusion is detrimental on an industrial scale in the furnace in which heat treatment for austenization and press-hardening takes place.

Example 1c

Another series of samples is made, designated 7, 8, and 9.

Samples are obtained from Usibor® AluSi® 14 µm steel sheets further provided on one side of the sheet with a second zinc coating deposited by electroplating using a zinc sulfate bath. Depending on the samples, the thickness of the zinc coating varies from 0.5 µm to 1.5 µm.

For zinc deposition by electroplating, first, degreasing of the sheet is carried out by immersion for 3 seconds in a Novaclean® 301 solution at a temperature of 80° C. Degreasing is followed by rinsing with water. Then, brightening is carried out by immersion for 4 seconds in a sulfuric acid solution at ambient temperature. Brightening is followed by rinsing with water. The sheet is then immersed in an electrolytic bath comprising $H_2SO_4$ and $ZnSo_4$ at a temperature of 50° C. The current density applied to the steel sheet 15 A/dm². The pH of the bath is 3.

For each sample, the coated sheet is cut to obtain a blank. The blank is then heated at a temperature of 900° C. for a period of 5 minutes 30 seconds. The blank is then transferred to a press, then hot-stamped to obtain a part. Finally, said part is cooled to obtain martensitic transformation hardening.

Degreasing and phosphatation as defined in Example 1a are then performed on the hardened parts obtained. The surface of these phosphated samples is observed with SEM. The results are shown in the table below:

| | Sample | | |
|---|---|---|---|
| | 000007 | 8 | 9 |
| Steel sheet | Usibor ® AluSi ® 14 µm + zinc | Usibor ® AluSi ® 14 µm + zinc | Usibor ® AluSi ® 14 µm + zinc |
| Type of deposit | Zn deposited by electro-plating | Zn deposited by electro-plating | Zn deposited by electro-plating |
| Thickness of the layer | 0.5 µm | 1.0 µm | 1.5 µm |
| Coverage rate | >95% | >95% | >98% |

It is noted that all samples exhibit a high degree of phosphate crystal coverage on the surface of the hardened part.

Example 2: Adhesion of the Cataphoresis Layer Test

This method is used to determine the adhesion of the cataphoresis layer deposited on the press-hardened part.

A 20 µm cataphoresis layer is deposited on samples 7 to 9 obtained in Example 1c. To this end, samples 7 to 9 are dipped in a bath comprising an aqueous solution comprising Pigment Paste® W9712 and Resin Blend® W7911 from PPG Industries. A voltage of 180 V is applied for 180 seconds with a voltage gradient of 0 to 180 V for the first 30 seconds. After cataphoresis deposition is carried out, the part is rinsed in water and then cured in an oven at a temperature of 178° C. for 30 minutes. Painted press-hardened parts are thereby obtained.

Example 2a: Dry E-Coat Adhesion Test

A cutter is used to make a grid on painted parts. Thereafter, paint that has peeled from the part is evaluated with the naked eye: 0 indicates excellent, that is, none of the paint peeled and 5 indicates very poor, that is, more than 65% of the paint peeled. The results are shown in the table below:

| | Sample | | |
|---|---|---|---|
| | 10 | 11 | 12 |
| Zn thickness | 0.5 µm | 1.0 µm | 1.5 µm |
| Paint adhesion | 0 | 0 | 5 |

It is noted that paint adhesion is excellent when the hardened part is prepared from a steel sheet provided with a zinc coating having a thickness of 0.5 µm or 1.0 µm. However, when the hardened part is prepared from a steel sheet having a zinc layer having a thickness of 1.5 µm, adhesion of the cataphoresis layer is very poor.

Example 2b: Wet E Coat Adhesion Test

Firstly, painted parts are immersed in demineralized water in a closed chamber for 10 days at a temperature of 50° C. Then, the grid described in Example 2a is made. The following results were obtained:

| | Sample | | |
|---|---|---|---|
| | 13 | 14 | 15 |
| Zn thickness | 0.5 μm | 1.0 μm | 1.5 μm |
| Paint adhesion | 0 | 1 | 4.5 |

It is noted that paint adhesion is very good when the hardened part is prepared from a steel sheet provided with a zinc coating having a thickness of 0.5 μm or 1.0 μm. However, when the hardened part is prepared from a steel sheet provided with a zinc layer having a thickness of 1.5 μm, adhesion of the cataphoresis layer is poor.

Example 3: Corrosion Test

This method is used to determine resistance to corrosion, particularly the presence of red rust on a painted part.

Samples 16 to 18 were prepared by applying the method described in Example 2. In this example, the thickness of the deposited cataphoresis layer is 8 μm. To this end, the total time for cataphoresis layer deposition is reduced to 30 seconds.

This test consists of subjecting the painted parts to 6 corrosion cycles according to the new VDA 231-102 standard. A cycle consists of placing samples in a closed chamber wherein an aqueous solution of 1 wt-% sodium chloride is sprayed on samples at a rate of 3 mL/h while the temperature is varied from 50° C. to −15° C. and the humidity level is varied from 50% to 100%. This cycle is shown in FIG. 5.

The presence of red rust is evaluated with the naked eye: 3 indicates excellent, in other words, there is little or no red rust and 0 indicates very poor, in other words, there is a large amount of red rust.

| | Sample | | |
|---|---|---|---|
| | 16 | 17 | 18 |
| Zn thickness | 0.5 μm | 1.0 μm | 1.5 μm |
| Corrosion | 2.5 | 2.5 | 1 |

It is noted that when the painted part is prepared from a steel sheet provided with a zinc coating having a thickness of 0.5 μm or 1.0 μm, the resistance to red rust is very good. However, when the painted part is prepared from a steel sheet provided with a zinc coating having a thickness of 1.5 μm, the resistance to red rust is poor.

Parts hardened according to the invention thus enable good paint adhesion and good resistance to red rust.

Example 4: Adhesion Test

This method is used to determine the force required to detach two steels bonded together to form a sandwich. These steels are obtained from Usibor® AluSi® steel sheets that are either uncoated or zinc-coated according to the invention.

To this end, Samples 19 and 20 were obtained from a Usibor® AluSi® 14 μm steel sheet further provided with a second zinc coating deposited by electroplating having a thickness of 0.6 μm.

Samples 21 and 22 were obtained from a Usibor® AluSi® 25 μm steel sheet further provided with a second zinc coating deposited by electroplating having a thickness of 0.6 μm.

Samples 23 and 24 are obtained from a Usibor® AluSi® 25 μm steel sheet.

For zinc deposition by electroplating, first of all, a first degreasing of the sheet is performed by spraying a Garbo-clean® S5170-S5093 solution at a temperature of 80° C. Thereafter, a second degreasing is performed by immersion in the same solution at a temperature of 40° C. Degreasing is followed by rinsing with water. Then, brightening is performed with a sulfuric acid solution. Brightening is followed by rinsing with water. The sheet is thereafter immersed in an electrolytic bath comprising $H_2SO_4$ and $ZnSO_4$. Thereafter, in each case, an uncoated or a zinc-coated Usibor® AluSi® steel sheet is cut to obtain a blank. The blank is then heated at a temperature of 900° C. for a period ranging from 5 to 10 minutes. The blank is then transferred to a press; then it is hot-pressed to obtain a part. Finally, said part is cooled to obtain martensitic transformation hardening.

For each of the samples, two equivalent steel sheets were bonded using Betamate 1480V203G crash adhesive from the DOW company. These samples were then heated for 30 minutes at 180° C. to cure the crash adhesive. After cooling, a mechanical stress is applied to both sides of each of the sheets in order to detach the two steel sheets. The mean shear stress is then measured in Megapascals (MPa).

The results are shown in the table below:

| | Sample | | | | | |
|---|---|---|---|---|---|---|
| | 19 | 20 | 21 | 22 | 23 | 24 |
| Steel sheet | Usibor ® AluSi ® 14 μm + Zn | Usibor ® AluSi ® 14 μm + Zn | Usibor ® AluSi ® 25 μm + Zn | Usibor ® AluSi ® 25 μm + Zn | Usibor ® AluSi ® 25 μm | Usibor ® AluSi ® 25 μm |
| Heating time 900° C. | 5 minutes | 10 minutes | 5 minutes | 10 minutes | 5 minutes | 10 minutes |
| Type of deposit | Zn deposited by electroplating | Zn deposited by electroplating | Zn deposited by electroplating | Zn deposited by electroplating | x | x |
| Layer thickness | 0.6 μm ± 0.2 μm | 0.6 μm ± 0.2 μm | 0.6 μm ± 0.2 μm | 0.6 μm ± 0.2 μm | x | x |
| Mechanical stress (MPa) | 39 | 38 | 37 | 37 | 37 | 38 |

It is noted that a high shear stress is obtained for each sample. Thus, for Samples 19 to 22, this means that the zinc-coated bonded interfaces, that is, the interface between the aluminum-based coating and the ZnO layer obtained during heat treatment and the interface between the same ZnO layer and the crash adhesive, are not fragile.

Example 5: Diffused Hydrogen Test

This method is used to determine the amount of hydrogen absorbed during austenitic heat treatment.

Sample 25 was obtained from a Usibor® AluSi® 25 μm steel sheet further provided with a second zinc coating deposited by electroplating having a thickness of 0.6 μm.

Sample 26 is obtained from a Usibor® AluSi® 25 μm steel sheet.

For zinc deposition by electroplating, the method described in Example 4 was repeated.

Then, for each sample, the uncoated or the zinc-coated Usibor® AluSi® steel sheet is cut to obtain a blank. Then the blank is heated at a temperature of 900° C. for a time of 6 minutes 30 seconds. The blank is then transferred to a press, and then it is hot-pressed to obtain a part. Finally, said part is cooled to obtain martensitic transformation hardening.

Finally, measurement of the amount of hydrogen absorbed by samples during heat treatment was carried out by thermal desorption using a TDA or Thermal Desorption Analyser. To this end, each sample, placed in a quartz chamber, is slowly heated in an infrared furnace under a nitrogen stream. The hydrogen/nitrogen mixture released is captured by a leak detector and the concentration of hydrogen is measured with a mass spectrometer. The results are shown in the table below:

| | Sample | |
| --- | --- | --- |
| | 25 | 26 |
| Steel sheet | Usibor ® AluSi ® 25 μm + Zn | Usibor ® AluSi ® 25 μm |
| Heating time 900° C. | 6 minutes 30 seconds | 6 minutes 30 seconds |
| Type of deposit | Zn deposited by electro- plating | x |
| Layer thickness | 0.6 μm ± 0.2 μm | x |
| Amount of hydrogen desorbed (ppm) | 0.2 | 0.15 |

It is noted that the amount of desorbed diffused oxygen is similar whether the sample is an uncoated steel sheet or a steel sheet coated with zinc according to the invention.

Example 6: Welding Test

Example 6a: Welding Range

This method is used to determine the valid welding intensity range for a sample, that is, the intensity range over which spot welding may be performed without disadvantages such as expulsion of metal from the metal coating. The welding range is to generally be greater than 1 kA as per automobile manufacturer specifications.

Sample 27 was obtained from a Usibor® AluSi® 14 μm steel sheet further provided with a second zinc coating deposited by electroplating having a thickness of 0.6 μm.

For deposition by electroplating, the method described in Example 4 was repeated.

Then, the sample was cut to obtain a blank. The blank was heated at a temperature of 900° C. for a period of 5 minutes 30 seconds. The blank was then transferred to a press, then hot-stamped to obtain a part. Finally, said part was cooled to obtain martensitic transformation hardening.

Sample 28 was prepared by applying the method described in Example 5.

In this test, for each of the samples, two equivalent steel sheets were spot welded. To this end, electrodes are placed on both sides of each steel sheet coated according to the invention. A compressive force of 450 daN is applied between the electrodes. Alternating current of frequency 50 Hz applied to the electrodes passes through the sample, thus enabling the two steel sheets to be welded. Furthermore, an intensity of 3 kA is set at the beginning of the test and is increased gradually in order to determine the maximum intensity (Imax) at which molten metal is expelled. Thereafter, the intensity is decreased gradually in order to determine the minimum intensity (Imin) at which the diameter of the spot weld is less than the permissible threshold value. The limits of the welding range are Imax and Imin. The results are shown in the table below:

| | Sample | |
| --- | --- | --- |
| | 27 | 28 |
| Steel sheet | Usibor ® AluSi ® 14 μm + Zn | Usibor ® AluSi ® 25 μm + Zn |
| Heating time 900° C. | 5 minutes 30 seconds | 6 minutes 30 seconds |
| Type of deposit | Zn deposited by electro- plating | Zn deposited by electro- plating |
| Zn layer thickness | 0.6 μm ± 0.2 μm | 0.6 μm ± 0.2 μm |
| Welding intensity range (kA) | 1.6 kA | 1.4 kA |

It is noted that the welding range of each sample is greater than 1 kA.

Example 6b: Mechanical Properties

This method is used to determine mechanical properties of a spot weld. To this end, a mechanical stress is applied to a spot weld until it breaks.

Samples 29 and 31 are respectively Samples 27 and 28 of Example 6a.

Samples 30 and 32 are obtained respectively from Usibor® AluSi® 14 μm and Usibor® AluSi® 25 μm steel sheets.

In this test, samples comprise two equivalent steel sheets welded in the form of a cross. Force is applied so as to break the spot weld. This force, known as Cross Tensile Strength (CTS), is expressed in daN. It is a function of the diameter of the spot weld and of the thickness of the metal, that is, the thickness of the steel and of the metal coating. This makes it possible to calculate the coefficient α which is the ratio of the value of CTS to the product of the diameter of the spot weld multiplied by the thickness of the substrate. This coefficient is expressed in daN/mm². The results are shown in the table below:

| | Sample | | | |
|---|---|---|---|---|
| | 29 | 30 | 31 | 32 |
| Steel sheet | Usibor ®<br>AluSi ®<br>14 μm + Zn | Usibor ®<br>AluSi ®<br>14 μm | Usibor ®<br>AluSi ®<br>25 μm + Zn | Usibor ®<br>AluSi ®<br>25 μm |
| Heating time 900° C. | 5 minutes<br>30 seconds | 5 minutes<br>30 seconds | 6 minutes<br>30 seconds | 6 minutes<br>30 seconds |
| Type of deposit | Zn deposited<br>by electro-<br>plating | X | Zn deposited<br>by electro-<br>plating | X |
| Layer thickness | 0.6 μm ± 0.2 μm | x | 0.6 μm ± 0.2 μm | X |
| α (daN/mm2) | 72 | 68 | 70 | 70 |

It is noted that coefficients α for Samples 29 and 30 and for Samples 31 and 32 are similar.

Example 6c: Electrode Service Life

This method is used to determine electrode service life, that is, the number of spot welds that may be performed with a pair of electrodes before the electrodes are too deteriorated and the quality of the spot welds is no longer acceptable.

Samples 33 and 34 are respectively Samples 27 and 28 of Example 6a.

This test is to be performed with the same pair of electrodes used to perform the spot welds and their diameters are to be measured every 100 welds. In fact, the more a pair of electrodes is used for welding, the more the diameter of the spot welds will decrease. Therefore, there is a critical diameter for spot welds in automobile manufacturer specifications. This critical diameter is generally described as being 4×√t where t is the thickness of the metal, that is, the thickness of the sheet in mm. Below this diameter, the electrode is considered to be worn out.

The diameter of spot welds was measured as a function of the number of welds performed. As the metal thickness of samples 33 and 34 is 1.5 mm, the critical diameter of the spot weld is 4.89 mm. Tests were discontinued after 1000 weld points. The results are shown in the table below:

| | Number of spot welds | | | | | |
|---|---|---|---|---|---|---|
| | 200 | 400 | 600 | 800 | 1000 | Samples |
| Spot weld diameter (mm) | 6.45 | 6.55 | 6.40 | 5.8 | 5.6 | 33 |
| | 6.7 | 6.6 | 6.6 | 6.40 | 6.3 | 34 |

It is noted that the diameter of the spot welds is well above the limiting value 4.89 mm for all welds performed. Moreover, it is noted that the diameter of the welds decreases very little from 200 to 1000 welds.

What is claimed is:

1. A coated steel sheet for press hardening comprising:
a steel sheet;
an aluminum-based coating; and
a zinc coating over the aluminum-based coating, the zinc coating having a thickness less than or equal to 1.1 μm, the zinc coating being primarily zinc;
the coated steel sheet having a weight composition as follows:
0.20%≤C≤0.25%,
0.15%≤Si≤0.35%,
1.10%≤Mn≤1.40%,
0%≤Cr≤0.30%, 0%≤Mo≤0.35%,
0%≤P≤0.025%,
0%≤S≤0.005%,
0.020%≤Ti≤0.060%,
0.020%≤Al≤0.060%, and
0.002%≤B≤0.004%,
a balance of the composition being iron and unavoidable impurities resulting from processing.

2. A coated steel sheet for press hardening comprising:
a steel sheet;
an aluminum-based coating; and
a zinc coating over the aluminum-based coating, the zinc coating having a thickness less than or equal to 1.1 μm, the zinc coating being primarily zinc the coated steel sheet having a weight composition as follows:
0.24%≤C≤0.38%,
0.40%≤Mn≤3%,
0.10%≤Si≤0.70%,
0.015%≤Al≤0.070%,
0%≤Cr≤2%,
0.25%≤Ni≤2%,
0.020%≤Ti≤0.10%,
0%≤Nb≤0.060%,
0.0005%≤B≤0.0040%,
0.003%≤N≤0.010%,
0.0001%≤S≤0.005%, and
0.0001%≤P≤0.025%,
amounts of titanium and nitrogen satisfying Ti/N>3.42, and
amounts of carbon, manganese, chrome, and silicon satisfying $$2.6C + \frac{Mn}{5.3} + \frac{Cr}{13} + \frac{Si}{15} \ge 1.1\%,$$

a balance of the composition being iron and unavoidable impurities resulting from processing.

3. The coated steel sheet according to claim 2, further comprising one or more of the following elements by weight:
0.05%≤Mo≤0.65%,
0.001%≤W≤0.30%, and
0.0005%≤Ca≤0.005%.

4. A method for preparing the coated steel sheet according to claim 1, wherein the zinc coating is performed by cementation, by electroplating, or by sonic jet vapor deposition under vacuum.

5. The method according to claim 4 wherein when the zinc coating is deposited by cementation or electroplating, said zinc coating being directly deposited on the aluminum-based coating.

6. The method according to claim 5, wherein the zinc coating deposited by cementation is carried out by immersion or by spraying.

7. The method according to claim 5, wherein when the zinc coating is deposited under vacuum by sonic jet vapor, a thin layer of stainless steel is deposited between the aluminum-based coating and the zinc coating.

8. A method for preparing a press-hardened part coated with a phosphatable coating comprising the sequential steps of:

A) providing the coated steel sheet for press-hardening according to claim 1;

B) cutting the coated steel sheet obtained in step A) to obtain a blank; then

C) heating the blank at a temperature T1 in a range from 840° C. to 950° C. to obtain a completely austenitic structure in the steel;

D) transferring the blank to a press;

E) hot-pressing the blank to obtain a part;

F) cooling the part obtained in step E) to obtain a martensitic or a martensitic-bainitic structure in the steel composed of at least 75% equiaxed iron, an amount of martensite greater than or equal to 5% and less than or equal to 20%, an amount of bainite less than or equal to 10%.

9. The method according to claim 8, wherein step C) is implemented for a time t1 from 3 to 12 minutes in an inert atmosphere or an atmosphere comprising air.

10. The method according to claim 8, wherein during step E), hot-pressing is carried out at a temperature T2 ranging from 600° C. to 830° C.

11. A hardened part obtained by the method according to claim 8, comprising:

a ZnO layer; and a phosphate crystal layer on the ZnO layer obtained after an additional phosphatation step G).

12. The hardened part according to claim 11, wherein a degree of phosphate crystal coverage on the surface of the part is greater than or equal to 90%.

13. The hardened part according to claim 12, wherein the degree of phosphate crystal coverage on the surface of the part is greater than or equal to 99%.

14. The hardened part according to claim 11, further comprising a cataphoresis layer on the phosphate crystal layer.

15. The press hardened part according to claim 11 further comprising a cataphoresis layer on the phosphate crystal layer.

16. A motor vehicle comprising:

the press-hardened part according to claim 11.

17. A method of manufacturing motor vehicle parts comprising:

preparing the press hardened part according to claim 11.

\* \* \* \* \*